United States Patent [19]
Yoshida et al.

[11] Patent Number: 5,690,781
[45] Date of Patent: Nov. 25, 1997

[54] PLASMA PROCESSING APPARATUS FOR MANUFACTURE OF SEMICONDUCTOR DEVICES

[75] Inventors: Kazuyoshi Yoshida; Hidenobu Miyamoto, both of Tokyo, Japan

[73] Assignee: NEC Corporation, Tokyo, Japan

[21] Appl. No.: 527,847

[22] Filed: Sep. 13, 1995

[30] Foreign Application Priority Data

Sep. 16, 1994 [JP] Japan .................................. 6-258960

[51] Int. Cl.$^6$ ........................................... H01L 21/205
[52] U.S. Cl. .................. 156/345; 118/723 I; 118/723 IR; 315/111.51; 216/68
[58] Field of Search ....................... 156/643.1, 345; 216/68; 315/111.51, 111.21; 118/723 I, 723 IR

[56] References Cited

U.S. PATENT DOCUMENTS

| | | | |
|---|---|---|---|
| 5,155,331 | 10/1992 | Horiuchi et al. | 156/345 |
| 5,261,962 | 11/1993 | Hamamoto et al. | 118/723 |
| 5,277,751 | 1/1994 | Ogle | 156/643 |
| 5,346,578 | 9/1994 | Benzing et al. | 156/345 |
| 5,368,710 | 11/1994 | Chen et al. | 156/643 |
| 5,433,812 | 7/1995 | Cuomo et al. | 156/345 |
| 5,468,296 | 11/1995 | Patrick et al. | 118/723 I |

FOREIGN PATENT DOCUMENTS

| | | |
|---|---|---|
| 59-186327 | 10/1984 | Japan . |
| 1-087596 | 3/1989 | Japan . |
| 3-219620 | 9/1991 | Japan . |
| 4-120277 | 4/1992 | Japan . |

*Primary Examiner*—Robert Kunemund
*Assistant Examiner*—George Goudreau
*Attorney, Agent, or Firm*—Young & Thompson

[57] ABSTRACT

A plasma processing apparatus comprises a reaction chamber to hold a high-density plasma and having a dielectric plate window, a spiral coil placed outside the reaction chamber and close to the dielectric window, and a lower electrode which holds a wafer to be processed in place and installed in the reaction chamber facing the dielectric plate. A first radio frequency current supply to the coil, a mechanism for varying the distance between the coil and the dielectric plate window, and a second radio frequency voltage supply to the lower electrode is provided. Excellent uniformity of the ion current density of the plasma and hence etching rate is achieved by making the thickness of a central part of the dielectric plate window thicker than its peripheral parts. Also, the uniformity of the plasma and the etching rate is achieved by making the induction field produced by the coil axially symmetrical about the axial center of the reaction chamber. The etching profile and the material etching selectivity are controlled by moving the coil in the axial direction of the coil.

11 Claims, 11 Drawing Sheets

PLASMA PROCESSING APPARATUS FOR MANUFACTURE OF SEMICONDUCTOR DEVICES

BACKGROUND OF THE INVENTION

1. Field of the Invention

The present invention relates to an apparatus for plasma processing used for the manufacture of semiconductor devices.

2. Description of the Related Art

With the increase in the degree of integration, and hence the increase in the density of semiconductor devices, dry etching systems which can perform anisotropic etching on wafers are being widely used. For example, in dry etching systems using plasmas, etching is performed by the combined action of neutral radicals and ions formed in a plasma generated within a reaction chamber. Ions in the plasma are accelerated through the action of electric fields created in the reaction chamber to hit the wafer. However, these ions are scattered due to collision with neutral gas molecules, resulting in a change in the direction of movement. Therefore, these ions cannot strike the wafer surface perpendicularly, thus causing lateral etching (frequently called "side etching"), resulting in formation of etched structures different in geometric size from the mask. The number of neutral-gas molecules may be decreased to reduce the collision of ions with the neutral-gas molecules by lowering gas pressure in the reaction chamber. However, since the density of the plasma itself also decreases, insufficient etching selectivity, i.e., insufficient etching rate difference for different materials becomes a problem, pertaining to the different material underlying the material to be etched. Therefore, apparatuses using high density plasma sources for producing plasma with sufficient density in a low pressure region have been proposed.

An example of such a plasma generating apparatus is disclosed in a Japanese Laid-Open Patent Publication (Kokai), JPUPA 6-84811. FIG. 13 shows the structure of this apparatus. In this apparatus a magnetic field penetrating through a dielectric plate 55 and parallel to the dielectric plate 55 is generated in a reaction chamber 52 by flowing an RF current through a coil 45 having a planar side. The fluctuation in the thus generated magnetic field over time further produces an inductive electric field by electromagnetic induction, which in turn generates a low-pressure, high-concentration plasma. Also in this apparatus, ion energy incident to a to be ached wafer 59 is controlled by placing the wafer 59 on an electrode 56 installed in the reaction chamber 52 to face the dielectric plate 55, and simultaneously biasing this electrode to a certain voltage. The diameter of the coil 45 is smaller at the end than at the center in order to make the intensity of the generated magnetic field uniform.

In the plasma generating apparatus described above, the coil used for producing plasma is not symmetrical about the center of the reaction chamber where the to be processed wafer is placed. Therefore, the density of the plasma produced is also not axially symmetrical, and achieving a uniform plasma cannot be expected. Since the uniformity of the plasma affects the uniformity of the etching rate directly, acceptable uniformity of the etching rate, which is one of important parameters of etching, cannot be expected.

It is important that the method for making a plasma density uniform is a simple one so as to cope with the recent trend of increase in the diameter of wafers.

Also in conventional plasma generating apparatuses, etching conditions were required to be changed in order to control the etching selectivity and etching profiles.

OBJECT OF THE INVENTION

It is therefore an object of the present invention to provide a simple plasma generating apparatus which can meet requirements of increased wafers diameters, has a low-pressure/high-concentration plasma source with a capability of producing a uniform plasma and hence a uniform etching rate.

It is another object of the present invention to provide a method for producing plasma using the apparatus for producing plasma of the present invention, and controlling the selection ratio and the shape without changing the etching conditions.

SUMMARY OF THE INVENTION

An apparatus according to the present invention for producing low pressure/high concentration plasma comprises: a reaction chamber having a plate consisting of a dielectric material at an upper part of the chamber and being electrically grounded at other parts, a spiral coil placed outside the reaction chamber in the vicinity of the upper surface of the dielectric plate, an RF power source for supplying a high frequency current to the spiral coil, a tuning means for this RF power source and the coil, a means for introducing a plurality of gases into the reaction chamber, a means for controlling the pressure of the process gases, a lower electrode provided at the lower portion of the reaction chamber and on which the processed wafers are placed, a mechanical means to vary the distance between the dielectric plate and the spiral coil, and a means for supplying the lower electrode with a high frequency voltage. A uniform plasma and a uniform etching rate is achieved by making the dielectric plate thick at the center of the reaction chamber and thin at the peripheral portion of the chamber. Uniformity of the plasma and the etching rate is further achieved by forming the electric field induced by supplying an RF current to the coil to be axially symmetrical about the center of the reaction chamber.

In the above plasma generating apparatus, the etching profile and the selectivity are controlled by varying the distance between the dielectric plate and the spiral coil.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Figure 1A:
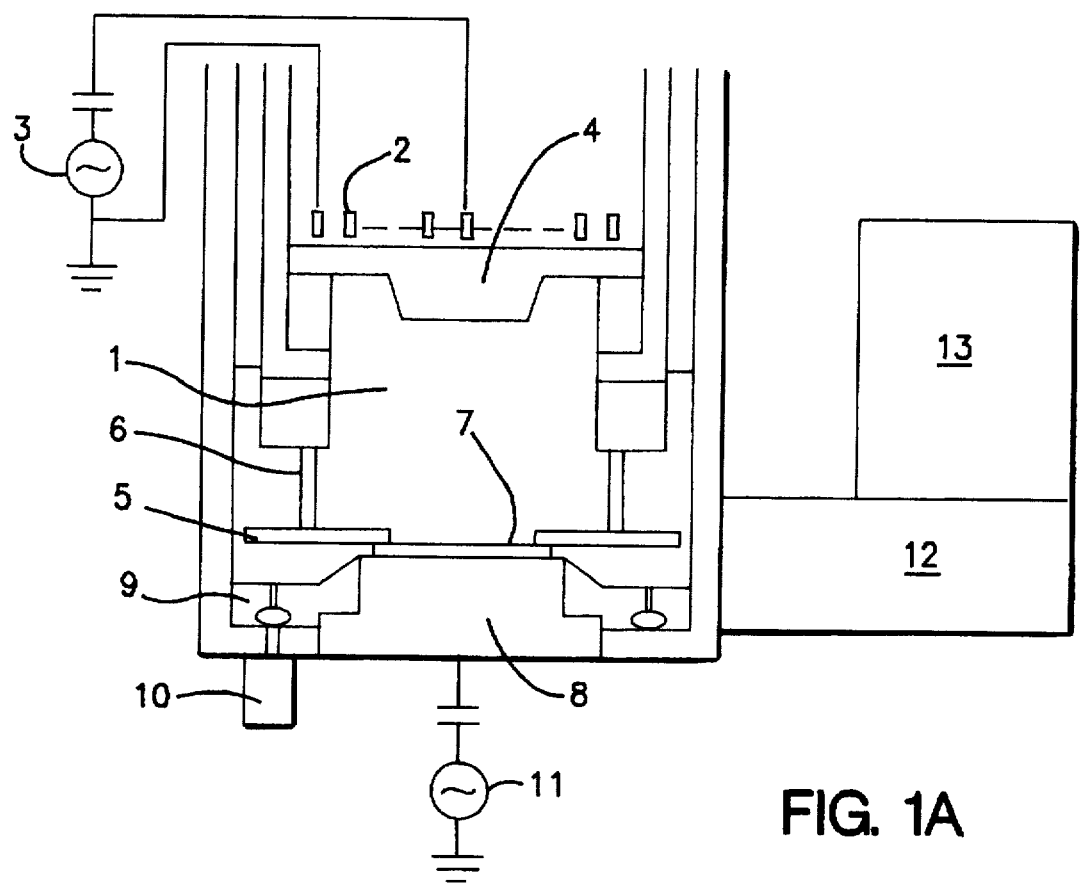
FIG. 1(a) is a schematic drawing illustrating a first embodiment of the present invention having a dielectric plate window which is thicker at the center of the reaction chamber, thinner at the periphery, and convex downward.
Figure 1B:
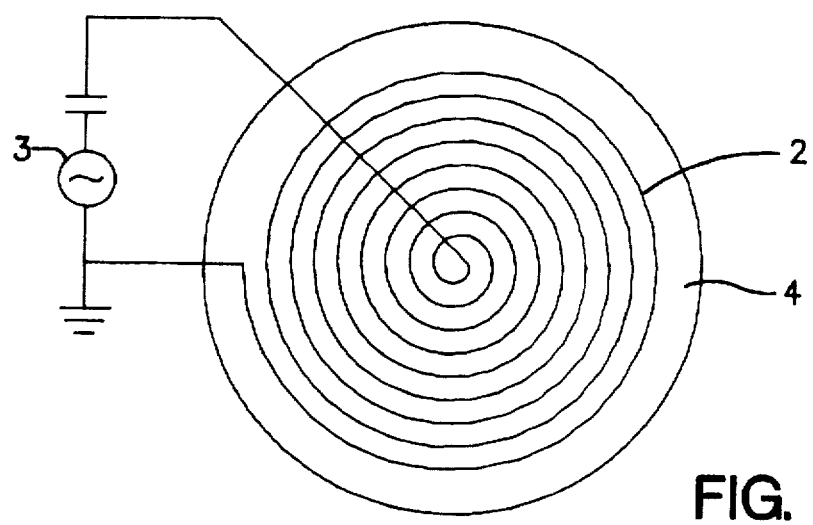
FIG. 1(b) is a schematic drawing illustrating the spiral coil of the first embodiment of the present invention.

FIG. 1 illustrates a first embodiment of the plasma processing apparatus of the present invention. The method for producing a plasma and the method for using the plasma for etching will be described in detail below.

Figure 2A:
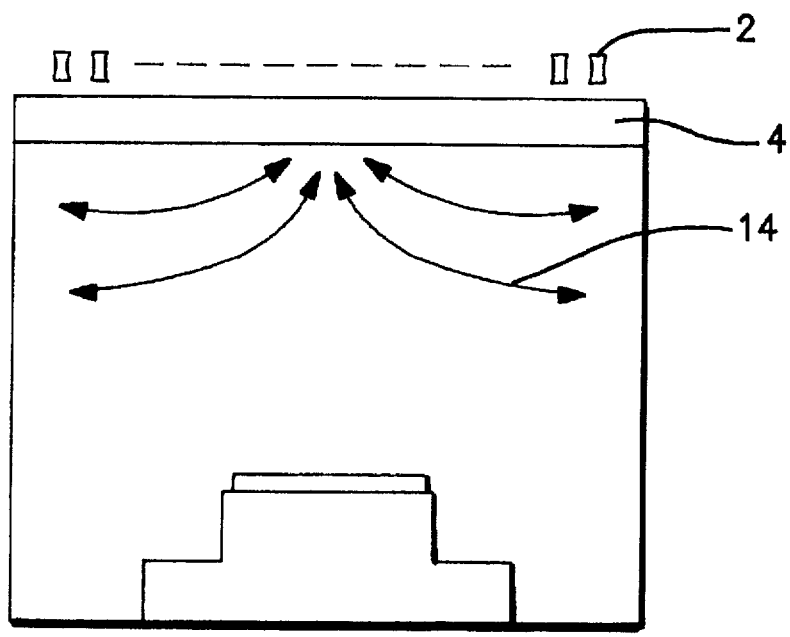
FIG. 2(a) shows schematically by arrows, the direction of the magnetic field produced by application of an RF voltage to the spiral coil.
Figure 2B:
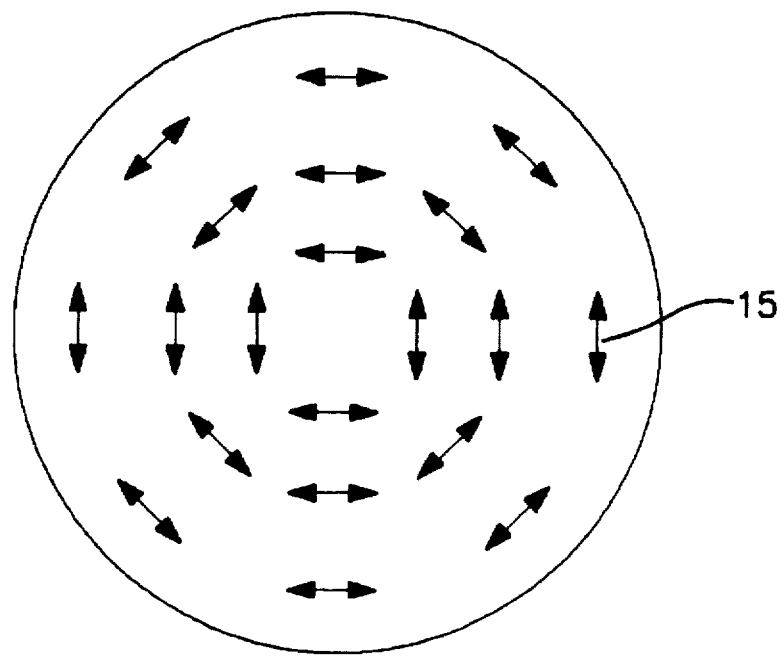
FIG. 2(b) shows schematically by arrows, the direction of the electric field produced by application of an RF voltage to the spiral coil.
Figure 3A:
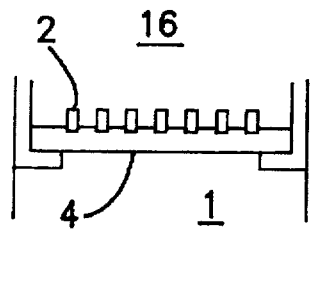
FIG. 3 shows 3 different plots of ion current density distribution for 3 types of dielectric plate window shapes.
Figure 3B:
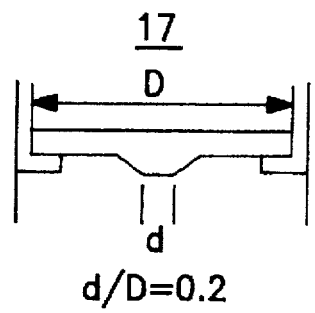
Figure 3C:
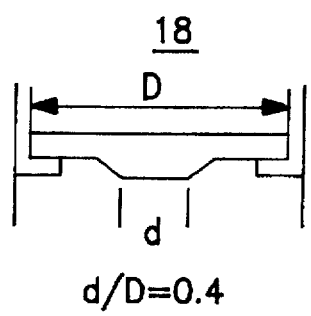
Figure 3D:
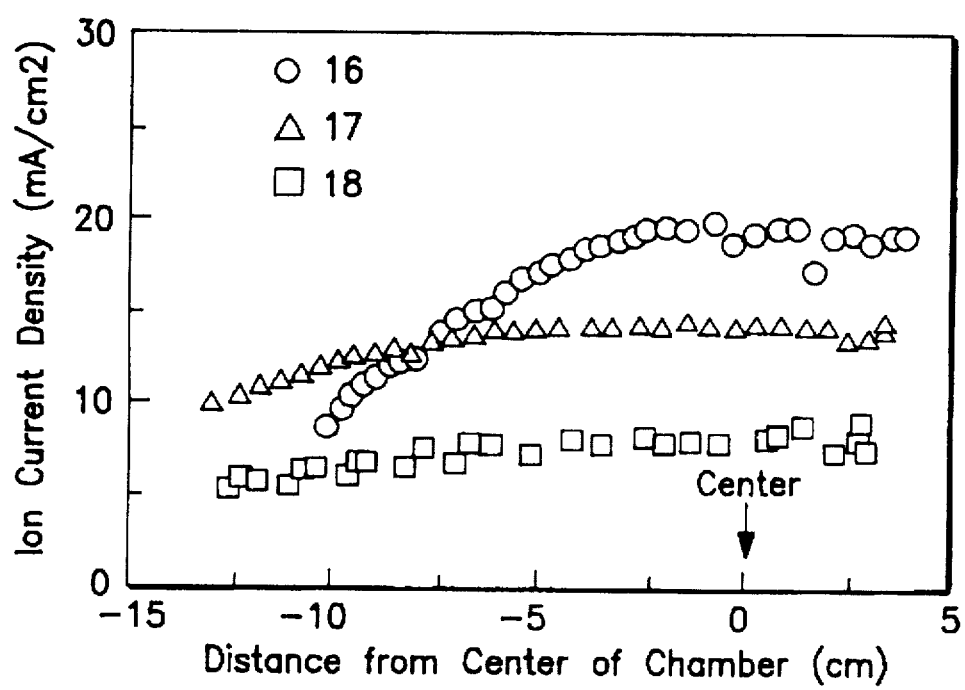

A semiconductor wafer 7 to be processed having a diameter of, for example, 6 inches is placed in a reaction chamber 1. The distance between the wafer 7 and the dielectric plate window 4 is adjusted, a process gas is introduced from the gas ring 9 into the reaction chamber 1, and the pressure in the reaction chamber 1 is adjusted to, for example, several millitorr. Under these conditions, a radio frequency (RF) current is supplied to a spiral coil 2 placed on the dielectric window 4 from an RF power source 3 of, for example, 13.56 MHz through a matching circuit not shown in FIG. 1. By this arrangement, a varying magnetic field 14 is produced in the reaction chamber 1, and an induction electric field 15 is produced by the electromagnetic induction of the varying magnetic field 14, as shown in FIG. 2(a) and FIG. 2(b), respectively. This induction field 15 causes the electrons in the reaction chamber 1 to move and repeatedly collide with the gas molecules to generate plasma. The generated plasma contains not only the above fully inductively coupled component but also a capacitively coupled component, wherein the coil and the plasma are directly coupled. The wafer 7 to be processed is etched by a plasma thus generated. In the plasma processing apparatus of the present invention, the lower electrode 8 on which the wafer 7 is placed is biased by the RF power source 11 to control the ion energy, i.e., the kinetic energy of the ions impinging on the surface of the wafer 7.

First, in order to check the effect the shape of the dielectric plate window has on the uniformity of the plasma, the distribution of ion current densities in the radial direction of the reaction chamber 1 was measured by changing the shape of the dielectric window. Dielectric plate windows having a uniform thickness 16, and that having a thick part at the center 17, and that having of a wider thick part 18 were compared. The result of the measurement is shown in FIG. 3. In the dielectric window 16 of a uniform thickness, the ion current density is high at the center, and the uniformity within a diameter of 6 inches was as low as ±15%. This is because the wound conductive material of the spiral coil 2 is equally spaced and wound to end at the center of the reaction chamber, so that the intensity of the induction field produced by the coil 2 is high at the center. In the dielectric window 17 having a thick part at the center for reducing the intensity of induction field at the center, the uniformity increased to ±5%, and in the dielectric window 18 having a widened thick part, the uniformity was further improved to ±3%.

Figure 4A:
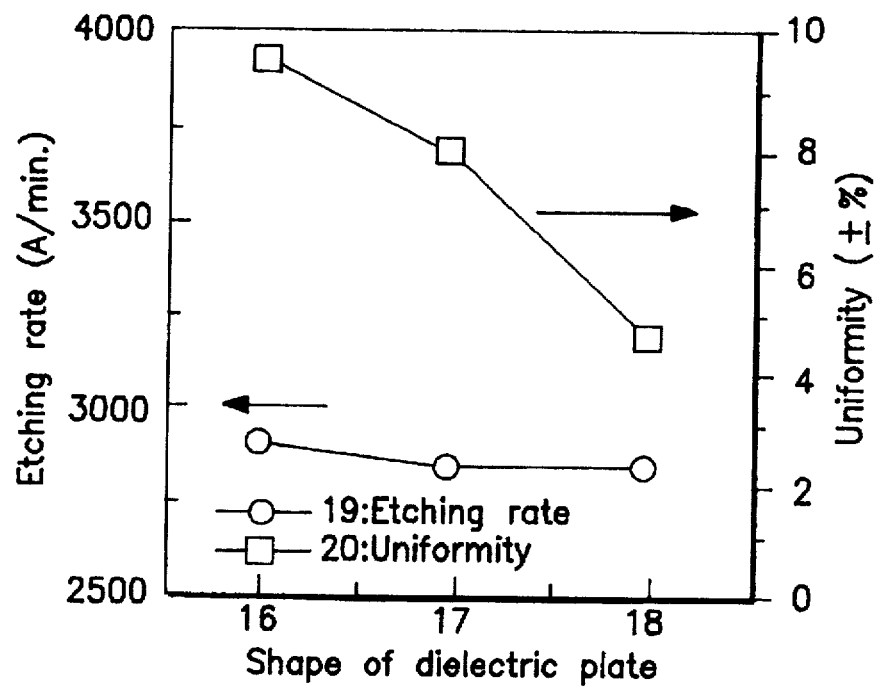
FIG. 4(a) shows, for $n^+$-type polysilicon etching, the dependency of the etching rate and uniformity on the shape of the dielectric plate window.
Figure 4B:
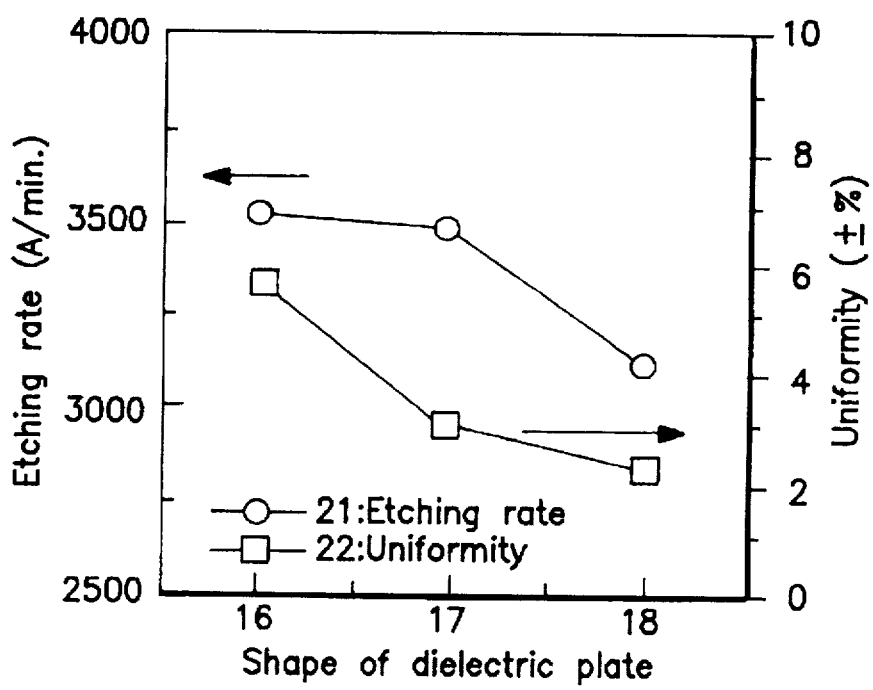
FIG. 4(b) shows, for WSi₂ etching, the dependency of the etching rate and uniformity on the shape of the dielectric plate window.

Since what is important for etching is the uniformity of the actual etching rate, the above dielectric windows 16, 17 and 18 were used, and the etching rates 19 and 21 for poly-silicon and WSi₂, respectively, were measured. The result is shown in FIG. 4(a) and FIG. 4(b), respectively. As the figures show, the uniformity of the etching rate 19 and 21 for polysilicon and WSi₂, respectively, corresponds to the uniformity of the plasma density, and improved from ±10% to ±4% for poly-silicon and ±7% to ±2.5% for WSi₂.

It was optimal for making the plasma density and etching rate uniform to have the diameter of the thick part 0.2–0.5 times the diameter of the dielectric plate, and the thickness of the thick part 2–5 times the thickness of the dielectric plate for an 8-turn spiral coil of a diameter of 8 inches.

Figure 5A:
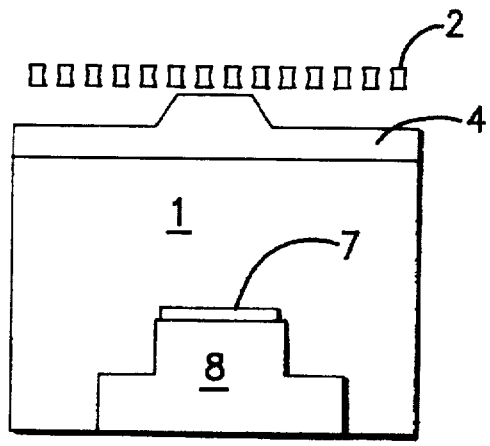
FIG. 5(a) schematically illustrates a second embodiment of the present invention, wherein a plano-convex dielectric plate window positioned to have the convex portion pointing away from the reaction chamber and a flat coil is combined.
Figure 5B:
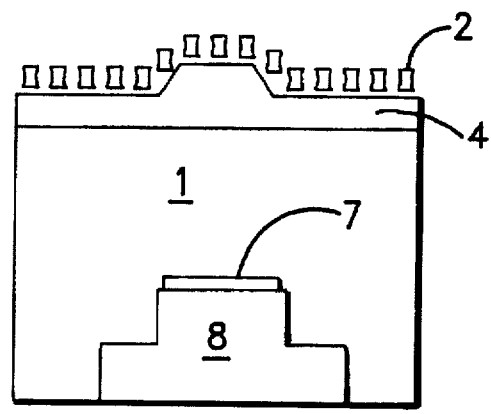
FIG. 5(b) schematically illustrates the second embodiment of the present invention, wherein a plano-convex dielectric plate window positioned to have the convex portion pointing away from the reaction chamber and a non-flat coil conforming to the convex shape of the plate is combined.
Figure 5C:
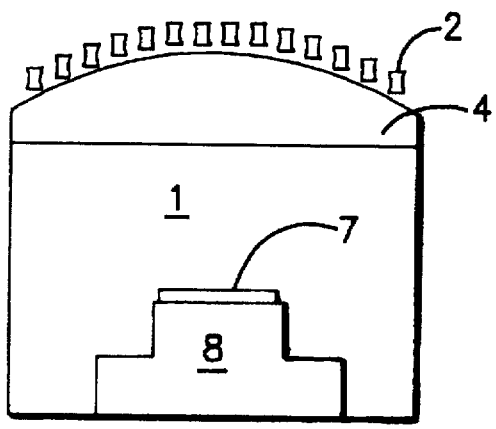
FIG. 5(c) schematically illustrates the second embodiment of the present invention, wherein a dome-shaped dielectric plate window positioned to have the convex side pointing away from the reaction chamber and a curved coil conforming to the convex shape of the dome is combined.

FIG. 5(a), (b) and (c) shows a second embodiment of the present invention, wherein the dielectric plate has a plano-convex shape or a dome-like shape with the convex side pointing upward, away from the reaction chamber. FIG. 5(a) shows the case where a flat coil is used with the upwardly convex dielectric plate. FIG. 5(b) shows the case where a coil is provided to conform along the upper surface of the upwardly convex dielectric plate; and FIG. 5(c) shows the case where a coil is provided to conform along the upper surface of the upwardly domed dielectric plate. By making the dielectric plate upwardly convex and pointing away from the reaction chamber, maintenance is made easier, and the distance between the dielectric plate window and the wafer is made constant. Of course, the same effect of making the plasma the and etching rate uniform as the plano-convex dielectric plate window with its convex part directed inwardly toward the center of the reaction chamber is obtained.

Figure 6A:
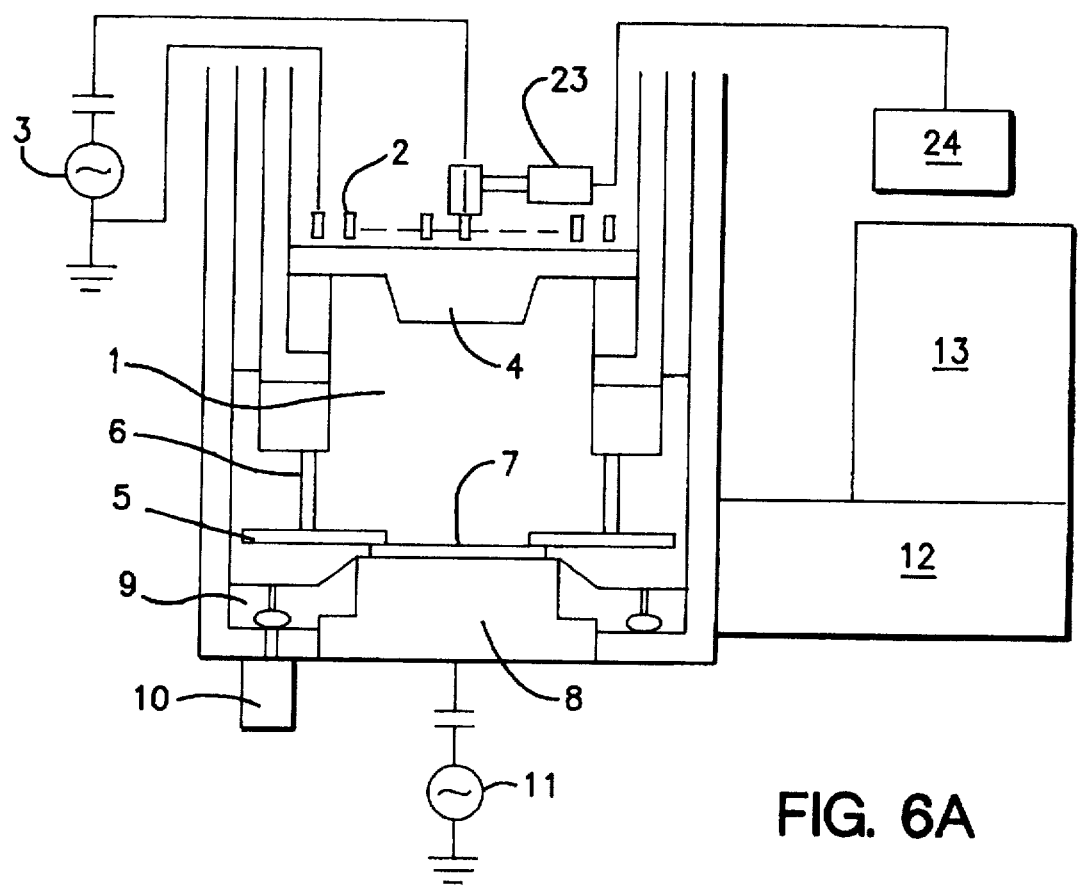
FIG. 6(a) is a schematic cross sectional drawing illustrating a third embodiment of the present invention, wherein a spiral coil is movable in a direction parallel to the main planar side of the dielectric plate window.
Figure 6B:
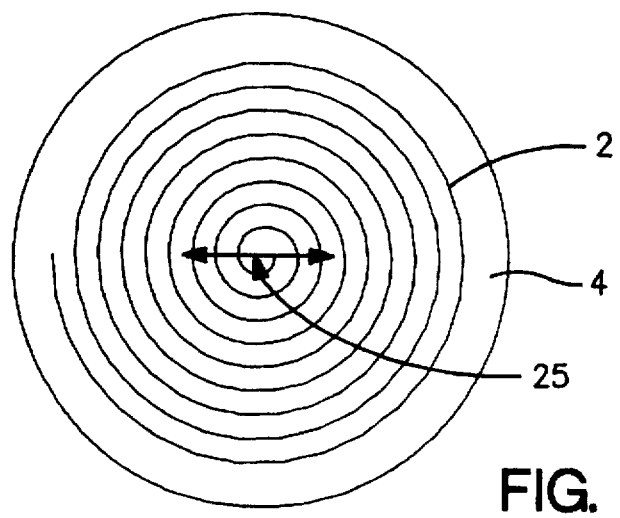
FIG. 6(b) is a schematic drawing illustrating a top view of the third embodiment of the present invention.
Figure 7:
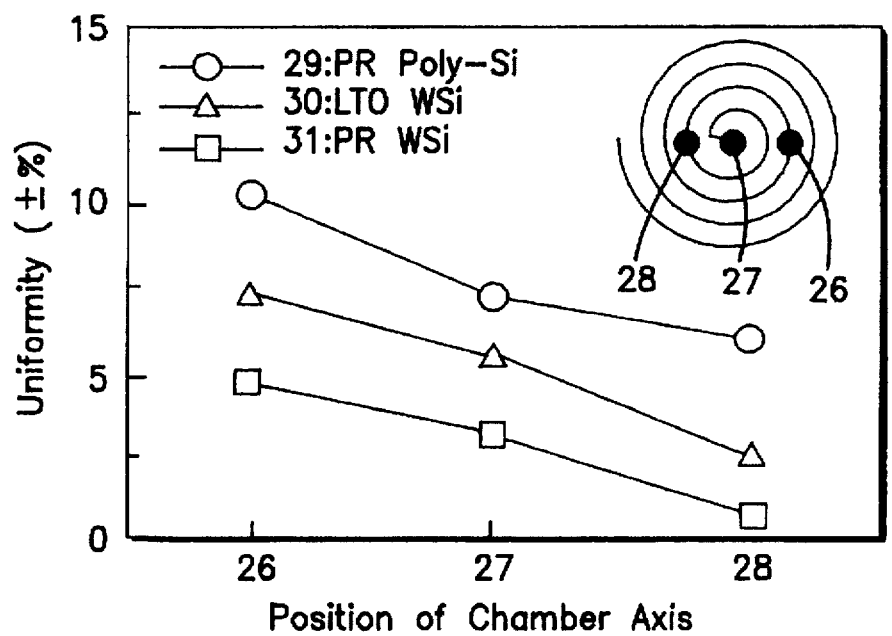
FIG. 7 shows the dependency of etching uniformity on locations in the radial direction of the coil.
Figure 13:
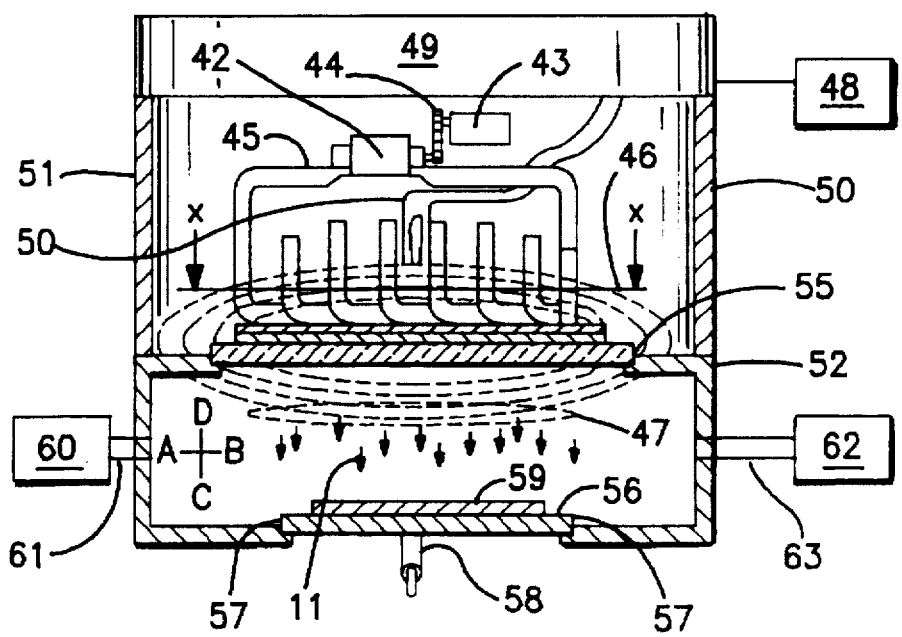
FIG. 13 illustrates an example of the related art.

FIG. 6(a) and FIG. 6(b) show a third embodiment of the present invention for making the etching rate distribution further uniform. In this embodiment, the spiral coil 2 is made movable in the direction parallel to the main planar surface of the dielectric plate, or in effect the radial direction of the reaction chamber 1 by a motor 23 and a control mechanism thereof. Since the spiral coil 2 is not axially symmetrical, the distribution of the etching rate is not symmetrical about the center of the wafer which is located on axis of the chamber. Therefore, the coil was moved ±1 cm in the radial direction 25, which creates the most change in the system, and the uniformity of etching rate of poly-silicon and $WSi_2$ was measured. The result is shown in FIG. 7. It is obvious as the graph shows, that the movement of the coil 2 in the radial direction of the reaction chamber 1 is effective in making the etching rate uniform, and the optimum location of the coil is when the center of gravity of the coil is matched with the axial center of the reaction chamber.

Figure 8A:
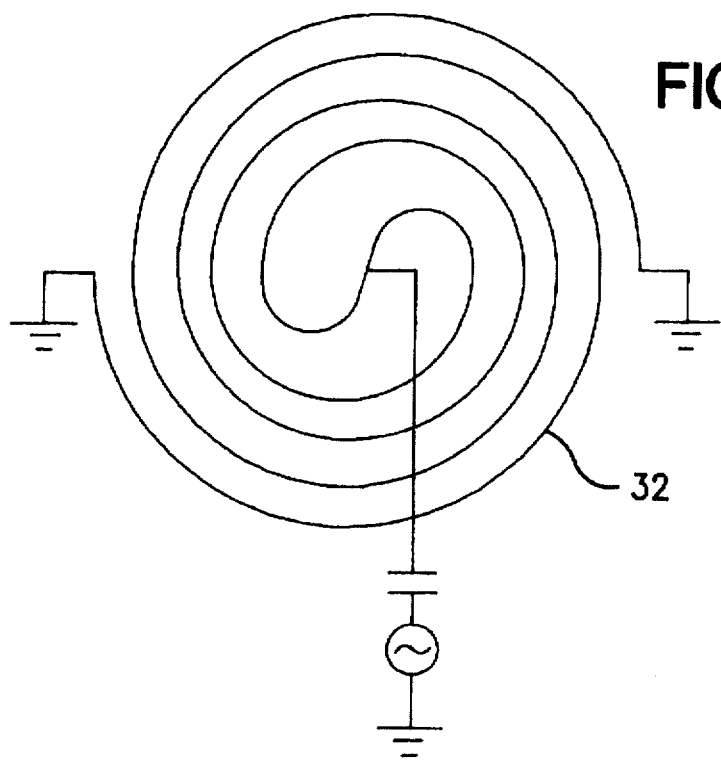
FIG. 8(a) illustrates a fourth embodiment of the present invention, wherein the coil consists of a combination of two spiral coils electrically connected and the shape of the combined coil is axially symmetrical.
Figure 8B:
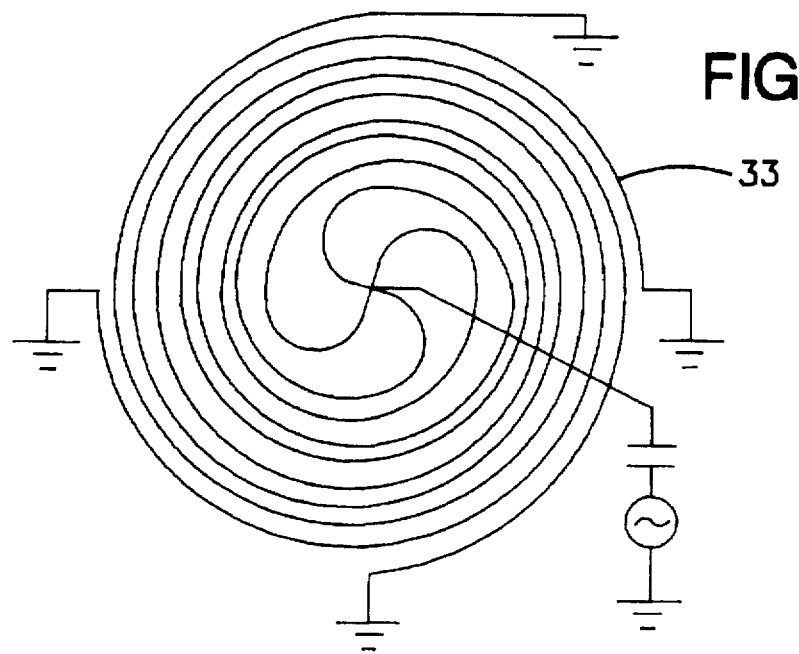
FIG. 8(b) illustrates another example of the fourth embodiment of the present invention, wherein the coil consists of a combination of four spiral coils electrically connected and the shape of the combined coil is axially symmetrical.

Although the above embodiments employ coils which are not axially symmetrical, FIG. 8(a) and FIG. 8(b) show an embodiment wherein a plurality of coils are combined in order to make the coils axially symmetrical about the center. In FIG. 8(a) and FIG. 8(b), two and four coils, respectively, are electrically connected together at the axis of the reaction chamber to form axially symmetrical shapes. Compared with other embodiments wherein the plasma is produced using a single coil, the same plasma density is obtained by a shorter coil length. By combining a plurality of coils to make them axially symmetrical, the same effect as in the third embodiment is achieved. Decrease in the length of a coil reduces the electric resistance of the coils, and voltage applied to the coils may be lowered from several kilovolts to several hundred volts. By this, the capacitively coupled component of the plasma is decreased so that sputtering of the dielectric plate is reduced, thus minimizing contamination due to the sputtered dielectric material (Si, $SiO_2$ or $O_2$ in the case of quartz, and Al or $Al_2O_3$ in the case of alumina ceramics).

Figure 9:
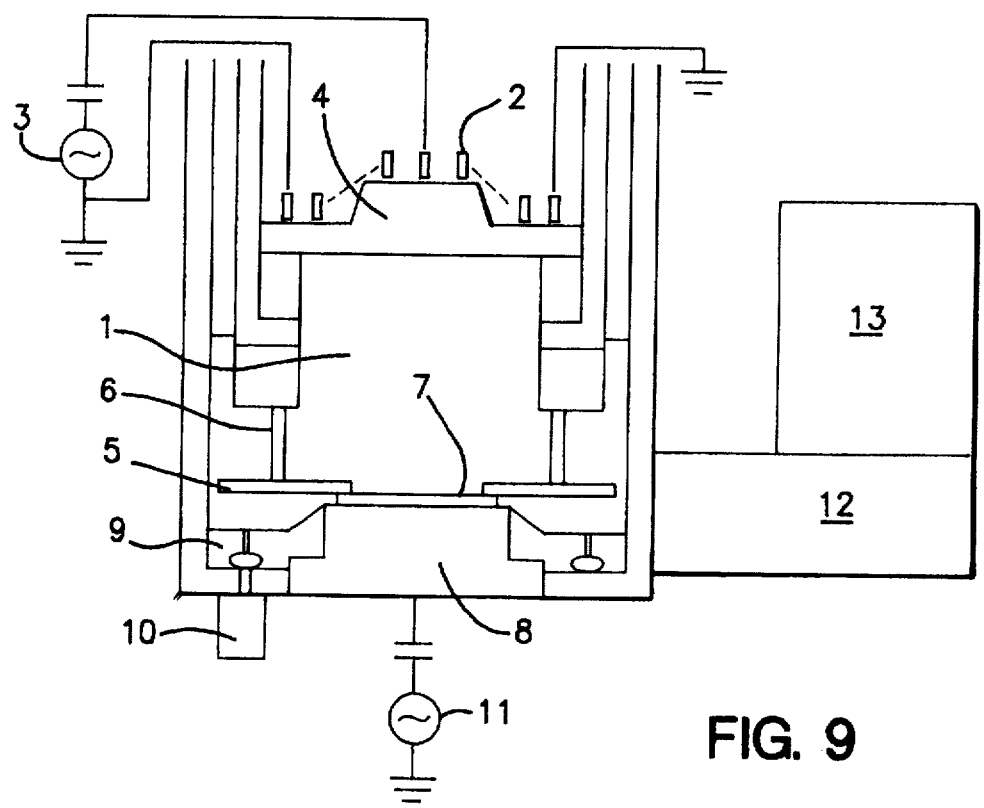
FIG. 9 illustrates a fifth embodiment of the present invention, wherein the shape of the coil is axially symmetrical and a plano-convex dielectric plate window positioned to have the convex portion pointing away from the reaction chamber is combined.

A fifth embodiment of the present invention is shown in FIG. 9. The dielectric plate window is provided outside the reaction chamber 1 and is placed to have the convex side pointing upward, away from the reaction chamber. An axially symmetrical coil is provided to conform along the upper surface of this dielectric plate. By employing this configuration, the flat side of the dielectric plate constitutes part of the inside wall of the chamber so that the maintenance of the chamber is made feasible. Also, since the center portion is thicker than the circumference, and since the coil is axially symmetrical about the center of the reaction chamber, the uniformity of the plasma and the etching rate is achieved.

Figure 10:
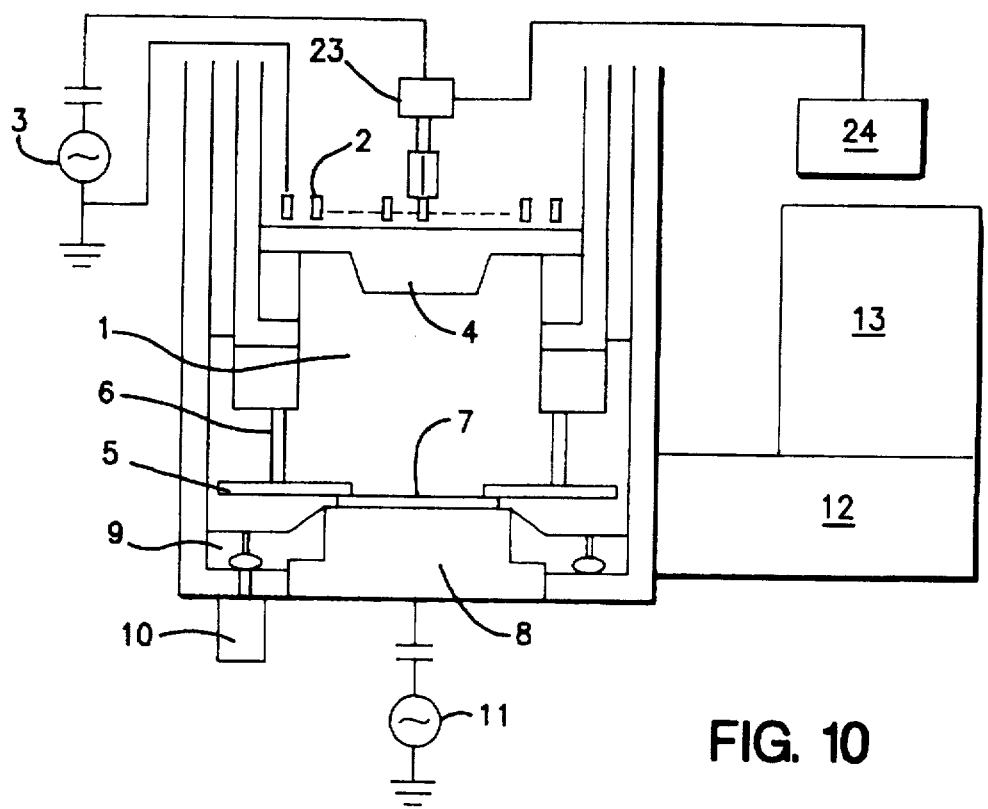
FIG. 10 illustrates a sixth embodiment of the present invention, wherein the coil is movable in its axial direction.

FIG. 10 shows a sixth embodiment of the present invention, wherein the coil is movable in the axial direction by use of a motor 23 and a control mechanism 24. In this case, the distance between the coil and the dielectric plate window can be varied for each etching step much as like varying the etching condition. By changing the distance between the coil and the dielectric window, the ratio of the inductively coupled component and the capacitively coupled component in the plasma can be changed.

Figure 11A:
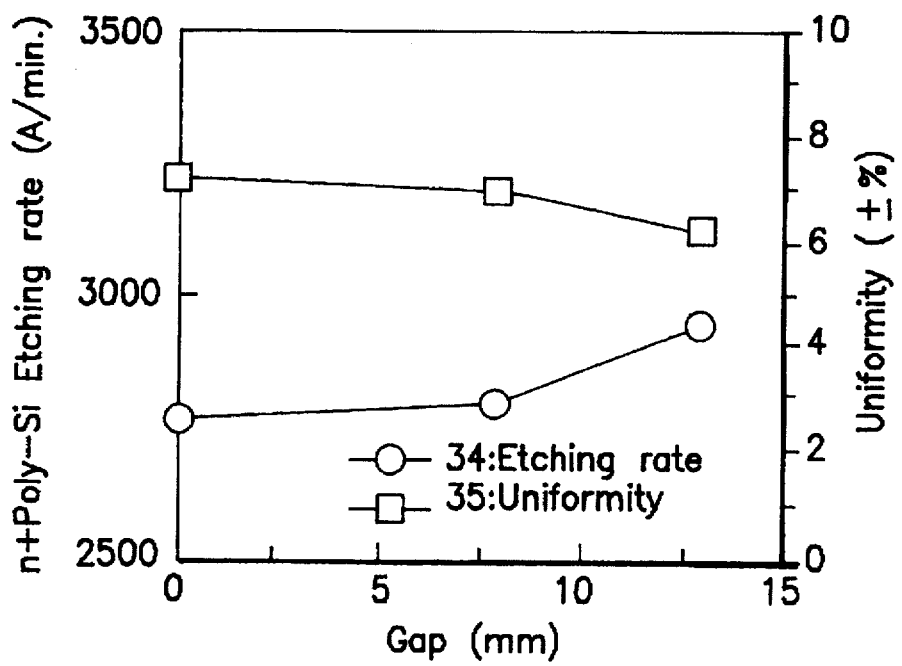
FIG. 11(a) shows the dependency of the etching rate and etching uniformity of polysilicon on locations in the axial direction of the coil.
Figure 11B:
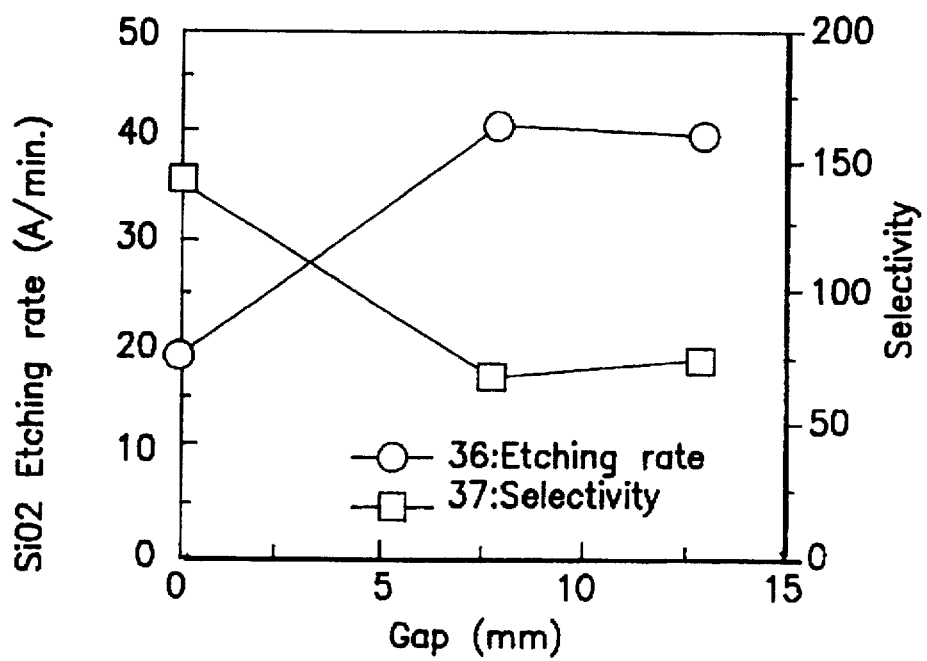
FIG. 11(b) shows the dependency of the etching rate and etching uniformity of SiO₂ on locations in the axial direction of the coil.
Figure 12A:
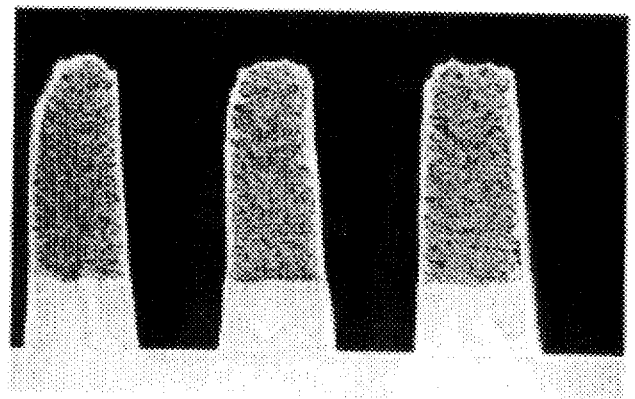
FIG. 12 shows, for two different taper angles, the etched profiles of poly-silicon when the distance between the coil and the dielectric window was varied.
Figure 12B:
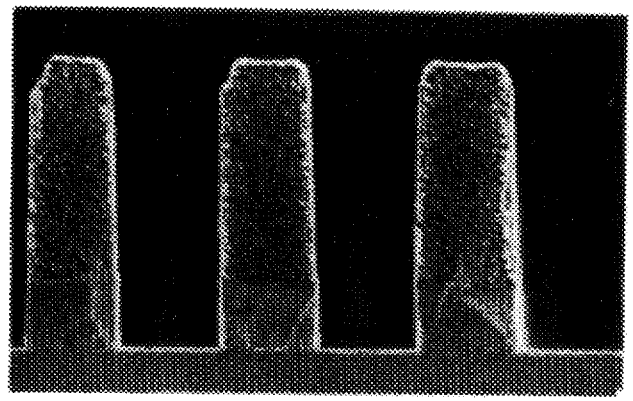
Figure 12C:
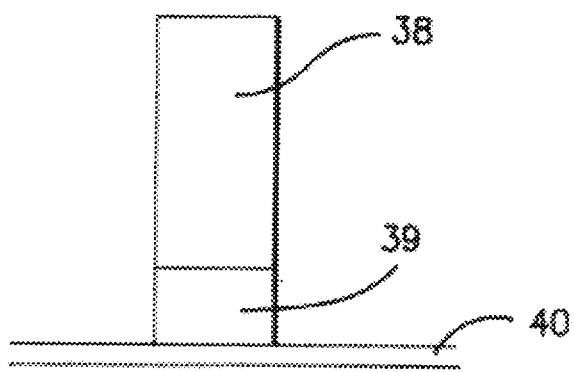

FIG. 10(a) shows the etching rate and etching uniformity for polysilicon etching observed when the distance between the coil and the dielectric window was changed. FIG. 11(b) shows the etching rate of $SiO_2$, and the etching selectivity of poly-silicon to $SiO_2$ observed when the distance between the coil and the dielectric window was changed. The selectivity can be varied from 60 and 140 without changing the poly-silicon etching rate using the otherwise same etching conditions, and the process margin can be expanded. FIG. 12 shows two cross sectional secondary electron microscope (SEM) photographs depicting the etched profile of a poly-silicon structure observed when the distance between the coil and the dielectric window was changed. The bottom figure is a schematic drawing showing the layer structure of the observed sample. It is found from these results that the taper angle (the angle made by the side wall and the bottom surface) can be varied from 80 to 90 degrees. Therefore, the etching profile can be controlled by changing the distance between the coil and the dielectric window during a main etching step and an over-etching step.

By the use of the plasma processing apparatus according to the present invention, the uniformity of the plasma ion current density is improved from ±15% to ±3%, and the uniformity of the etching rate is improved from ±10% to ±4% for polysilicon and from ±5% to ±1% for $WSi_2$. Also, the etching selectivity of polysilicon to $SiO_2$ can be varied from 60 to 140, and the taper angle can be varied from 80 to 90 degrees, without changing etching conditions other than the axial position of the coil.

While the present invention has been described in connection with certain preferred embodiments, it is to be understood that the subject matter encompassed by way of the present invention is not to be limited to those specific embodiments. For instance, the reaction chamber was assumed to have a cylindrical shape, but it may have a non-cylindrical geometry. Also, the dielectric plate window may be of material other than quartz or alumina ceramics. It is intended for the subject matter of the invention to include all alternatives, modifications and equivalents as can be included within the spirit and scope of the following claims.

We claim:

1. A plasma processing apparatus comprising:

a reaction chamber in which a plasma is generated, said chamber having a dielectric plate with an inner main surface and an outer main surface, said inner main surface facing the interior of said chamber, said chamber being electrically grounded except for said dielectric plate;

a spiral coil placed outside said reaction chamber and adjacent said outer main surface;

a radio frequency power source for supplying a first high frequency electrical current to said coil;

a tuning mechanism for electromagnetically matching said radio frequency power source and said coil;

at least one inlet for introducing a plurality of process gas into said vacuum reaction chamber;

a pressure controller for controlling the pressure of said process gas;

a lower electrode for receiving a wafer to be processed, said lower electrode being contained within said reaction chamber and positioned remote from said dielectric plate;

a mechanism for varying the distance between said dielectric plate and said spiral coil; and a second high frequency voltage supply connected to said lower electrode;

wherein said dielectric plate comprises a central portion with a constant first thickness, a circumferential portion with a constant second thickness, and a tapered portion between said central portion and said circumferential portion, said central portion of said dielectric plate having a diameter 0.2 to 0.4 times the diameter of said dielectric plate, and said first thickness being 2 to 5 times said second thickness.

2. The plasma processing apparatus according to claim 1, wherein said central portion of the dielectric plate projects from said peripheral portion interiorly of said chamber.

3. The plasma processing apparatus according to claim 1, wherein said central portion of the dielectric plate projects from said peripheral portion exteriorly of said chamber.

4. The plasma processing apparatus according to claim 3, wherein said spiral coil has a frustoconical shape conforming to said outer main side of the dielectric plate.

5. The plasma processing apparatus according to claim 1, wherein said coil is composed of an interfitted plurality of spiral coils electrically connected together to form an axially symmetrical coil.

6. The plasma processing apparatus according to claim 1, wherein said coil is composed of two interfitted spiral coils, said two spiral coils being electrically connected together at the center of said coil to form an axially symmetrical coil.

7. The plasma processing apparatus according to claim 1, wherein said coil is composed of four interfitted spiral coils, said four spiral coils being electrically connected together at the center of said coil to form an axially symmetrical coil.

8. A plasma processing apparatus comprising:
a reaction chamber in which a plasma is generated, said chamber having a dielectric plate with an inner main surface and an outer main surface, said inner main surface facing the interior of said chamber, said chamber being electrically grounded except for said dielectric plate;
a spiral coil placed outside said reaction chamber and adjacent said outer main surface;
a radio frequency power source for supplying a first high frequency electrical current to said coil;
a tuning mechanism for electromagnetically matching said radio frequency power source and said coil;
at least one inlet for introducing a plurality of process gas into said vacuum reaction chamber;
a pressure controller for controlling the pressure of said process gas;
a lower electrode for receiving a wafer to be processed, said lower electrode being contained within said reaction chamber and positioned remote from said dielectric plate;
a mechanism for varying the distance between said dielectric plate and said spiral coil; and
a second high frequency voltage supply connected to said lower electrode;
wherein said dielectric plate has a dome-like shape with a domed side facing away from said chamber, a central portion of said plate being 2 to 4 times thicker than a peripheral portion thereof, said spiral coil being shaped to conform with said domed side of said dielectric plate.

9. A plasma processing apparatus comprising:
a reaction chamber in which a plasma is generated, said chamber having a dielectric plate with an inner main surface and an outer main surface, said inner main surface facing the interior of said chamber, said chamber being electrically grounded except for said dielectric plate;
a spiral coil placed outside said reaction chamber and adjacent said outer main surface;
a radio frequency power source for supplying a first high frequency electrical current to said coil;
a tuning mechanism for electromagnetically matching said radio frequency power source and said coil;
at least one inlet for introducing a plurality of process gas into said vacuum reaction chamber;
a pressure controller for controlling the pressure of said process gas;
a lower electrode for receiving a wafer to be processed, said lower electrode being contained within said reaction chamber and positioned remote from said dielectric plate;
a first mechanism for varying the distance between said dielectric plate and said spiral coil;
a second high frequency voltage supply connected to said lower electrode;
a second mechanism for moving said coil within a range of 4 cm parallel to said dielectric plate; and
a computer-controlled mechanism for regulating an extent of coil movement by said first and second moving mechanisms;
wherein said dielectric plate has a central portion having a thickness greater than a peripheral portion thereof.

10. The plasma processing apparatus according to claim 9, wherein said coil has a center of gravity aligned with a central axis of said reaction chamber.

11. A plasma processing apparatus comprising:
a reaction chamber in which a plasma is generated, said chamber having a dielectric plate with an inner main surface and an outer main surface, said inner main surface facing the interior of said chamber, said chamber being electrically grounded except for said dielectric plate;
a spiral coil placed outside said reaction chamber and adjacent said outer main surface;
a radio frequency power source for supplying a first high frequency electrical current to said coil;
a tuning mechanism for electromagnetically matching said radio frequency power source and said coil;
at least one inlet for introducing a plurality of process gas into said vacuum reaction chamber;
a pressure controller for controlling the pressure of said process gas;
a lower electrode for receiving a wafer to be processed, said lower electrode being contained within said reaction chamber and positioned remote from said dielectric plate;
a second high frequency voltage supply connected to said lower electrode;
a mechanism for changing the distance between said coil and said dielectric plate from 0 to 15 mm perpendicular to said coil so as to control a ratio of an inductively coupled component and a capacitively coupled component in said plasma; and
a computer-controlled mechanism for regulating an extent of coil movement by said distance changing mechanism;
wherein said dielectric plate has a central portion having a thickness greater than a peripheral portion thereof.

* * * * *